US008796665B2

(12) United States Patent
Sills et al.

(10) Patent No.: US 8,796,665 B2
(45) Date of Patent: Aug. 5, 2014

(54) SOLID STATE RADIATION TRANSDUCERS AND METHODS OF MANUFACTURING

(75) Inventors: Scott E. Sills, Boise, ID (US); Anton J. De Villiers, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 284 days.

(21) Appl. No.: 13/219,518

(22) Filed: Aug. 26, 2011

(65) Prior Publication Data
US 2013/0048940 A1 Feb. 28, 2013

(51) Int. Cl.
*H01L 33/30* (2010.01)
*H01L 33/06* (2010.01)
*H01L 33/08* (2010.01)
*H01L 33/48* (2010.01)

(52) U.S. Cl.
USPC .......... 257/13; 257/88; 257/99; 257/E33.025; 257/E33.008

(58) Field of Classification Search
USPC .......... 257/13, 88, 99, 76, E33.025, E33.008, 257/21
See application file for complete search history.

(56) References Cited

U.S. PATENT DOCUMENTS

| 5,780,321 | A | 7/1998 | Shieh et al. |
| 7,358,173 | B2 | 4/2008 | Shei et al. |
| 2008/0105888 | A1 | 5/2008 | Wang et al. |
| 2009/0230410 | A1 | 9/2009 | Joung |
| 2011/0101404 | A1* | 5/2011 | Fu et al. .......... 257/98 |
| 2013/0087764 | A1* | 4/2013 | Kwak et al. .......... 257/13 |

FOREIGN PATENT DOCUMENTS

| WO | 2009051178 A1 | 4/2009 |
| WO | 2010005138 A1 | 1/2010 |

OTHER PUBLICATIONS

Atwater Jr., H.A., Ion Beam Enhanced Grain Growth in Thin Films, RLE Technical Report No. 527, Massachusetts Institute of Technology, Research Laboratory of Electronics, pp. 1-224, Mar. 1987.
Atwater, H.A. et al., Mechanisms for Crystallographic Orientation in the Crystallization of Thin Silicon Films from the Melt, J. Mater. Res., vol. 3, No. 6, pp. 1232-1237, Nov./Dec. 1988.
Atwater, H.A. et al., Zone-Melting Recrystallization of Thick Silicon on Insulator Films, Materials Letters, vol. 2, No. 4A, pp. 269-273, Mar. 1984.
Choi, J.-H. et al. Zone Melting Recrystallization of Polysilicon by a Focused-Lamp with Unsymmetric Trapezoidal Power Distribution, Journal of Electronic Materials, vol. 20, No. 3, pp. 231-235, Mar. 1991.
Colinge, J.-P., Silicon-on-Insulator Technology: Materials to VLSI, 2nd Edition, pp. 16-27 and 52-65, Sep. 1997.

(Continued)

*Primary Examiner* — Cathy N Lam
(74) *Attorney, Agent, or Firm* — Perkins Coie LLP

(57) ABSTRACT

Solid state radiation transducer (SSRT) assemblies and method for making SSRT assemblies. In one embodiment, a SSRT assembly comprises a first substrate having an epitaxial growth material and a radiation transducer on the first substrate. The radiation transducer can have a first semiconductor material grown on the first substrate, a second semiconductor material, and an active region between the first and second semiconductor materials. The SSRT can also have a first contact electrically coupled to the first semiconductor material and a second contact electrically coupled to the second semiconductor material. The first substrate has an opening through which radiation can pass to and/or from the first semiconductor material.

9 Claims, 9 Drawing Sheets

(56) References Cited

OTHER PUBLICATIONS

Geis, M.W. et al., (Invited) Silicon Graphoepitaxy, Proceedings of the 12th Conference on Solid State Devices, Tokyo 1980, Japanese Journal of Applied Physics, vol. 20, Supplement 20-1, pp. 39-42, 1981.

Geis, M.W. et al., Grapho-Epitaxy of Silicon on Fused Silica using Surface Micropatterns and Laser Crystallization, J. Vac. Sci. Technol., vol. 16, No. 6, pp. 1640-1643, Nov./Dec. 1979.

Geis, M.W. et al., Summary Abstract: Silicon Graphoepitaxy, J. Vac. Sci. Technol., vol. 18, No. 2, pp. 229-230, Mar. 1981.

Geis, M.W. et al., Zone-Melting Recrystallization of Si Films with a Moveable-Strip-Heater Oven, J. Electrochem. Soc.: Solid State Science and Technology, vol. 129, No. 12, pp. 2812-2818, Dec. 1982.

Givargizov, E.L, Graphoepitaxy as an Approach to Oriented Crystallization on Amorphous Substrates, Journal of Crystal Growth, vol. 310, No. 7-9, pp. 1686-1690, Apr. 2008.

Klykov, V.I. et al. Artificial Epitaxy (Diataxy) of Silicon and Germanium, Acta Physica Academiae Scientiarum Hungaricae, vol. 47, Nos. 1-3, pp. 167-183, Mar. 1979.

Minagawa, Y. et al. Fabrication of (111)-Oriented Si Film with a Ni/Ti Layer by Metal Induced Crystallization, Jpn. J. Appl. Phys., vol. 20, Part 2, No. 3A, pp. L186-L188, Mar. 2001.

Moon, B.Y. et al. Study on the Polycrystalline Silicon Films Deposited by Inductively Coupled Plasma Chemical Vapor Deposition, Mat. Res. Soc. Symp. Proc., vol. 685E, pp. D5.2.1-D5.2.6, 2001.

Naomoto, H. et al., Characterization of Thin-Film Silicon Formed by High-Speed Zone-Melting Recrystallization Process, Solar Energy Materials and Solar Cells, vol. 48, Nos. 1-4, pp. 261-267, Nov. 1997.

Pauli, M. et al., Large Area and Rapid Thermal Zone Melting Crystallization of Silicon Films on Graphite Substrates for Photovoltaic Use, Conference Record of the 23rd IEEE Photovoltaic Specialists Conference, pp. 195-200, May 1993.

Scharff, W. et al., Flash-Lamp-Induced Crystal Growth of Silicon on Amorphous Substrates Using Artificial Surface-Relief Structures, Physica Status Solidi (a), vol. 74, No. 2, pp. 545-552, Dec. 1982.

Wan, J. et al., Growth of Crack-Free Hexagonal GaN Films on Si(100), Applied Physics Letters, vol. 79, No. 10, pp. 1459-1461, Sep. 2001.

Yoon, S.M. et al., Numerical Simulation of Scanning Speed and Supercooling Effects During Zone-Melting-Recrystallization of SOI Wafers, Mat. Res. Soc. Symp. Proc., vol. 205, pp. 453-458, 1990.

\* cited by examiner

SOLID STATE RADIATION TRANSDUCERS AND METHODS OF MANUFACTURING

TECHNICAL FIELD

The present technology is related to solid state radiation transducers (SSRTs) and methods for manufacturing such transducers. Several embodiments of the technology are related to SSRTs that have openings through a growth substrate that has been packaged.

BACKGROUND

Mobile phones, personal digital assistants, digital cameras, MP3 players, and other portable electronic devices utilize solid state lighting (SSL) devices, such as light emitting diodes (e.g., LEDs), for backlighting and other purposes. SSL devices are also used for signage, indoor lighting, outdoor lighting, and other types of general illumination. FIG. 1A is a cross-sectional view of an existing SSL device 10 at an intermediate stage of manufacturing. As shown in FIG. 1A, the SSL device 10 includes a growth substrate 20 and an LED structure 21 on the growth substrate 20. The growth substrate 20 includes a buffer material 22, and the LED structure has an N-type gallium nitride (N-type GaN) 24 grown on the buffer material 22, an active region 25 grown on the N-type GaN 24, and P-type gallium nitride (P-type GaN) 26 grown on the active region 25. The active region 25 can contain gallium nitride/indium gallium nitride (GaN/InGaN) multiple quantum wells (MQWs). The SSL device 10 can also include a conductive layer 27 deposited on the P-type GaN 26, a mirror 28 deposited on the conductive layer 27, and a diffusion barrier 29 or bonding material on the mirror 28. After forming the mirror 28 and/or the diffusion barrier 29, a support substrate 30 is bonded to the diffusion barrier 29.

FIG. 1B is a cross-sectional view of the SSL device 10 at a subsequent stage of manufacturing after the growth substrate 20 has been removed to expose the N-type GaN 24 and the device is inverted relative to FIG. 1A. A conductive material 32 is then deposited on the N-type GaN 24. The conductive material 32 can be a transparent conductive material, such as indium tin oxide (ITO). The conductive material 32 can define a first contact electrically coupled to the N-type GaN 24, and the conductive material 27, the mirror 28 and/or the diffusion barrier 29 can define a second contact electrically coupled to the P-type GaN 26.

FIG. 1C shows a packaged device 40 that includes a support 50 carrying the SSL device 10 and a converter material 60. The support 50 includes a first contact 51 electrically coupled to the first contact 32 (FIG. 1B) and a second contact 52 electrically coupled to the conductive material 27 (FIG. 1B). In operation, an electrical voltage is applied to the SSL device 10 via the contacts 51 and 52, and in response the LED structure 21 produces a first emission (e.g., a blue light) that stimulates the converter material 60 to emit a second emission (e.g., a yellow light). The combination of the first and second emissions appears white to human eyes if matched appropriately.

One drawback of manufacturing the SSL device 10 illustrated in FIG. 1B is that it is expensive to handle and package. Packaging and handling of the SSL device 10, in fact, are a substantial fraction of the total manufacturing cost.

BRIEF DESCRIPTION OF THE DRAWINGS

Many aspects of the present technology can be better understood with reference to the following drawings. The components in the drawings, however, are not necessarily to scale. Instead, emphasis is placed on clearly illustrating the principles of the present technology. Additionally, like reference numbers designate corresponding parts throughout the several views and drawings.

DETAILED DESCRIPTION

Embodiments of the presently disclosed technology are directed generally to SSRT assemblies, such as wavelength converters for SSL devices, and associated systems and methods. As used hereinafter, the term "SSL device" generally refers to devices with LEDs, organic light emitting diodes (OLEDs), laser diodes (LDs), polymer light emitting diodes (PLEDs), and/or other sources of illumination other than electrical filaments, plasma, or gases. Specific details of several embodiments of SSRT assemblies and associated systems and methods are described below. The terms "SSRT" and "radiation transducer" generally refer to die or other structures that include a semiconductor material as the active medium to convert electrical energy into electromagnetic radiation in the visible, ultraviolet, infrared, and/or other spectra. SSRTs can alternately include solid-state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 2-5B.

Briefly described, SSRT assemblies in accordance with a particular embodiment of the disclosed technology include a first substrate having an epitaxial growth material, a radiation transducer, and an opening in the first substrate through which radiation can pass. The radiation transducer can have a first semiconductor material grown on the first substrate, a second semiconductor material, and an active region between the first and second semiconductor materials. The opening in the first substrate is aligned with the radiation transducer such that the radiation can pass to and/or from the first semiconductor material. For example, the opening can extend completely through the growth substrate and expose portions of the first semiconductor material. Other systems, methods, features and advantages of the presently disclosed technology will be apparent to one of ordinary skill in the art.

Figure 1A:
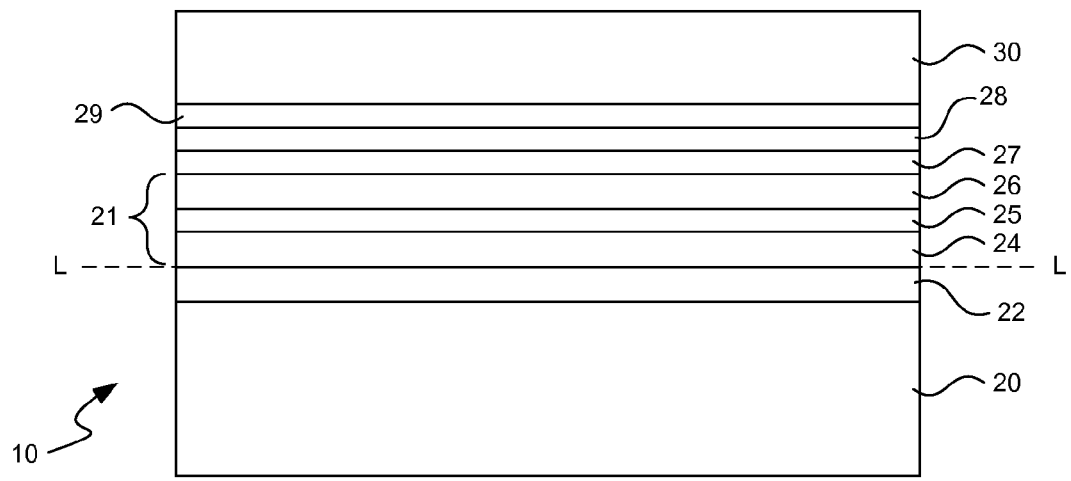
FIG. 1A is a partially schematic cross-sectional diagram of an existing SSL device at an intermediate stage of manufacturing in accordance with the prior art.
Figure 1B:
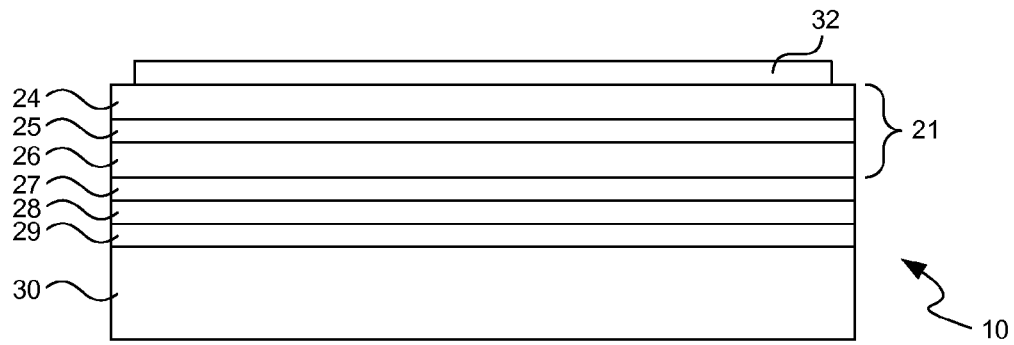
FIG. 1B is a partially schematic cross-sectional diagram of the SSL device shown in FIG. 1A at a subsequent stage of manufacturing in accordance with the prior art.
Figure 1C:
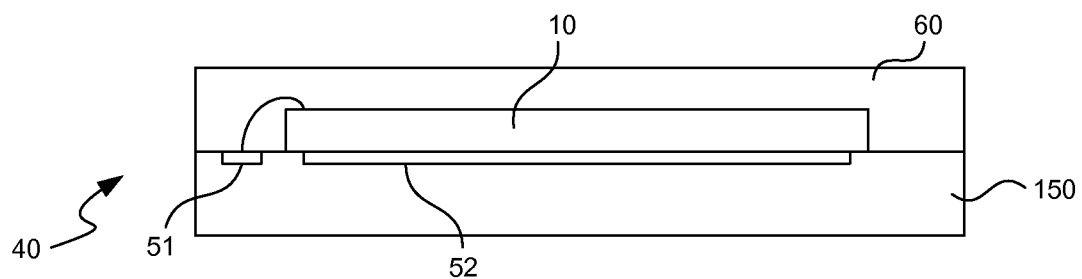
FIG. 1C is a partially schematic cross-sectional diagram of a packaged SSL device having a phosphor converter material in accordance with the prior art.
Figure 2:
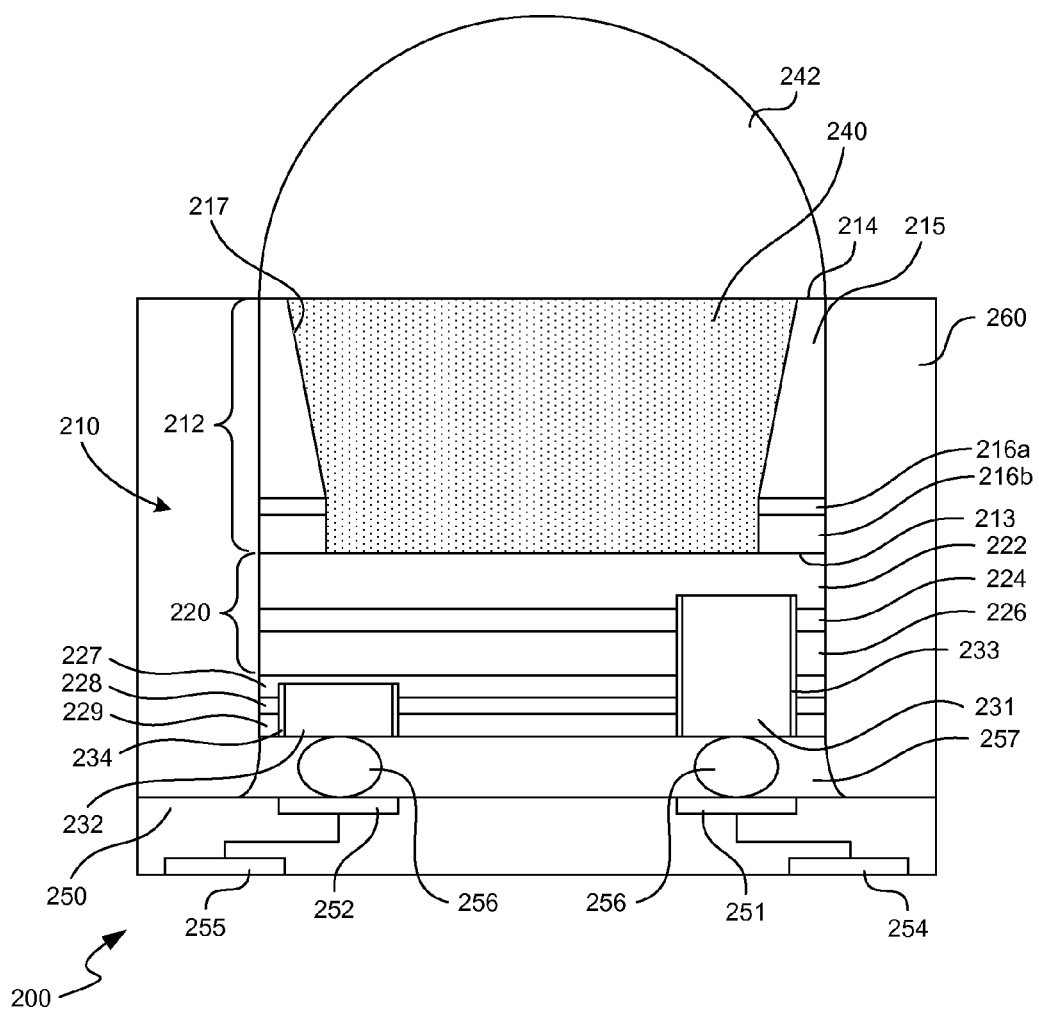
FIG. 2 is a partially schematic cross-sectional illustration of a system having a packaged SSRT assembly in accordance with an embodiment of the present technology.

FIG. 2 is a partially schematic cross-sectional illustration of a system 200 that produces energy from radiation (e.g., a photovoltaic device) and/or generates radiation from electricity (e.g., a SSL device) in accordance with an embodiment of the technology. In a particular embodiment, the system 200 includes a SSRT assembly 210, an interposer substrate 250 electrically coupled to the SSRT assembly 210, and an encapsulant 260 encasing at least a portion of the SSRT assembly 210. The interposer substrate 250 and encapsulant 260 can be similar to those known in the art for packaging memory, imagers, processors, SSL devices and other microelectronic devices.

The SSRT assembly 210 can include a first substrate 212, such as a growth substrate, having a first side 213, a second side 214, and a base material 215. As explained in more detail below, the base material 215 can be a semiconductor material, or the base material 215 can be a composite material upon which an epitaxial growth material is attached or otherwise formed. The first substrate 212 can further include one or more buffer materials on the base material 215. In the embodiment illustrated in FIG. 2, the first substrate 212 includes a first buffer material 216a on the base material 215 and a second buffer material 216b on the first buffer material 216a. The first substrate 212 can further include an opening 217 through the base material 215 and the buffer materials 216a-b. Although the opening 217 in FIG. 2 is shown as extending completely through the first substrate 212 from the first side 213 to the second side 214, in other embodiments the opening 217 may extend through only a portion of the thickness of the first substrate 212. Suitable materials for the base material 215 and the buffer materials 216a-b are described in more detail below with reference to FIGS. 3A and 3B.

The SSRT assembly 210 can also include a radiation transducer 220 formed on the first substrate 212. The radiation transducer 220 can be a solid state structure that produces light or other forms of radiation from electricity, or a photovoltaic device that produces electricity from radiation. In the embodiment illustrated in FIG. 2, the radiation transducer 220 has a first semiconductor material 222, an active region 224, and a second semiconductor material 226. Suitable materials for the radiation transducer 220 and processes for constructing the radiation transducer 220 are described in more detail below.

The SSRT assembly 210 can further include a conductive material 227 at the second semiconductor material 226 of the radiation transducer 220, an optional reflector 228 at the conductive material 227, and an optional diffusion barrier 229 at the reflector 228. As explained in more detail below, all of the materials of the radiation transducer 220, the conductive material 227, the reflector 228 and the diffusion barrier 229 are formed sequentially on the first substrate 212 as part of a wafer-level process.

The SSRT assembly 210 can further include a cover 240 at the opening 217. In the embodiment illustrated in FIG. 2, the cover 240 completely fills the opening 217. The cover 40 can include a transmissive matrix material, such as a transmissive polymer, and a phosphor mixed in with the matrix material. In other embodiments, the cover 240 can include a discrete layer or formation of transmissive matrix material in the opening 217 and a discrete layer of phosphor over the matrix material in the opening 217. In several embodiments, a lens 242 is formed on or attached to the cover 240. For example, the lens 242 can be a separate, pre-formed component that is mounted to the cover 240, or the lens 242 can be formed on the cover 240, or the cover 240 can be formed to have an exterior surface that defines the lens 242.

The SSRT assembly 210 further includes a first contact 231 electrically coupled to the first semiconductor material 222, and a second contact 232 electrically coupled to the conductive material 227. The first contact 231 can be electrically isolated from the active region 224, second semiconductor material 226, conductive material 227, reflector 228, and diffusion barrier 229 by a first dielectric liner 233. The second contact 232 can be electrically isolated from the reflector 228 and the diffusion barrier 229 by a second dielectric liner 234.

The interposer substrate 250 can accordingly include a first contact 251 electrically coupled to a first terminal 254, a second contact 252 electrically coupled to a second terminal 255, and electric couplers 256 electrically coupling the first contact 231 to the first contact 251 and a second contact 232 to the second contact 252. The packaged system 200 can further include an underfill material 257 between the SSRT assembly 210 and the interposer substrate 250 to protect the electric couplers 256 during encapsulation.

Figure 3A:
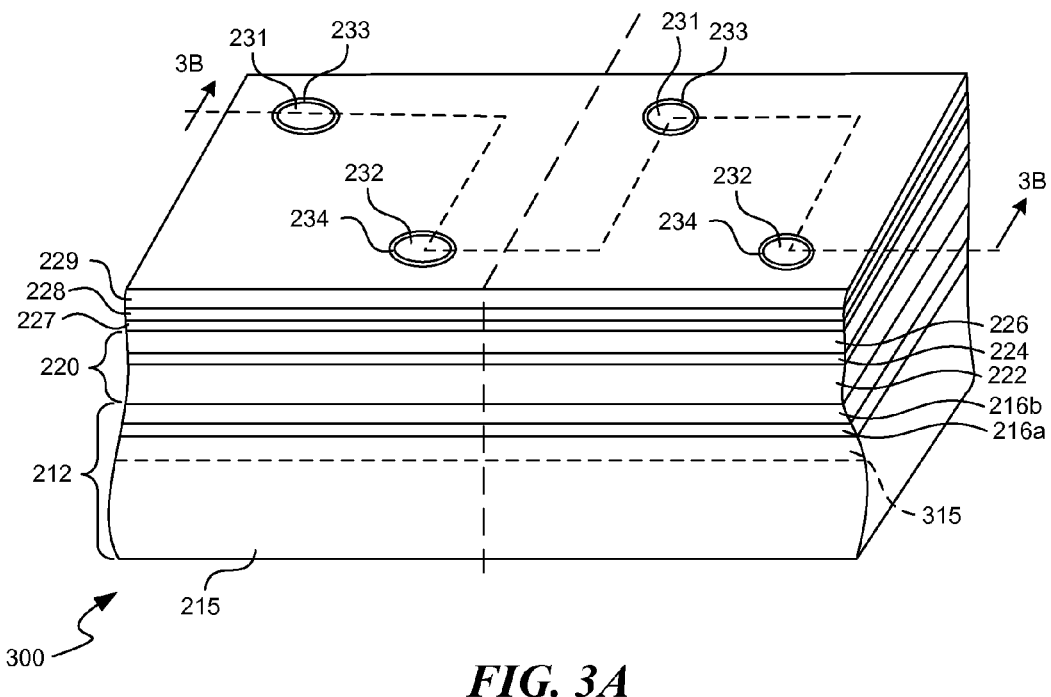
FIG. 3A is a partially schematic cross-sectional illustration of a portion of a method for manufacturing SSRT assemblies at the wafer level in accordance with an embodiment of the technology.
Figure 3B:
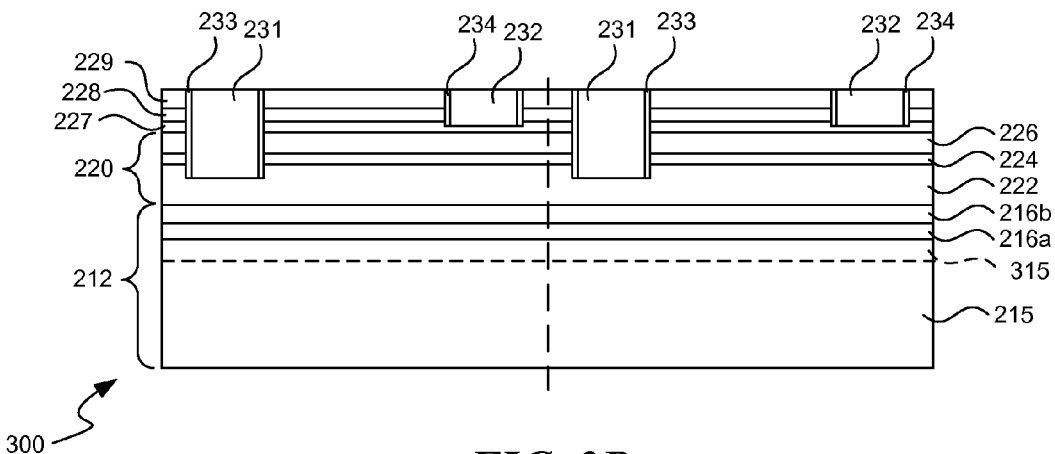
FIG. 3B is a partially schematic cross-sectional view taken along cross-section 3B-3B of FIG. 3A.

FIG. 3A is a partially schematic isometric view of a substrate assembly 300, and FIG. 3B is a partially schematic cross-sectional view of the substrate assembly 300 shown in FIG. 3A taken along cross section 3B-3B. FIGS. 3A and 3B illustrate a portion of a method for forming a plurality of SSRT assemblies at the wafer level in accordance with an embodiment of the technology. In one embodiment, a number of different materials are grown or otherwise deposited onto the base material 215 using epitaxial processes or other processes known in semiconductor manufacturing. The base material 215 can comprise silicon (Si), at least a portion of which has the Si(1,0,0) crystal orientation or the Si(1,1,1) crystal orientation at the substrate surface. In other embodiments, the base material 215 can include aluminum gallium nitride (AlGaN), gallium nitride (GaN), silicon carbide (SiC), sapphire ($Al_2O_3$), a combination of the foregoing materials, and/or other suitable substrate materials. In one embodiment, the growth substrate 212 includes a manufactured base material 215 and an epitaxial growth material 315 (shown as an optional material in dashed line) bonded or otherwise attached to the manufactured base material. For example, the manufactured base material 215 can comprise polyaluminum nitride and the epitaxial growth material 315 can comprise Si(1,1,1).

The first buffer material 216a can comprise aluminum nitride (AlN) and the second buffer material 216b can comprise AlGaN. The buffer materials 216a-b can be formed via metal-organic CVD ("MOCVD"), molecular beam epitaxy ("MBE"), liquid phase epitaxy ("LPE"), hydride vapor phase epitaxy ("HVPE"), and/or other suitable techniques. In further embodiments, one or both of the buffer materials 216a-b may be omitted, or the first substrate 212 can include additional buffer materials.

The radiation transducer 220 is subsequently formed on the growth substrate 212. In one particular embodiment, the first semiconductor material 222 is grown on the second buffer material 216b, the active region 224 is grown on the first semiconductor material 222, and the second semiconductor material 226 is grown on the active region 224. The first and second semiconductor materials 222 and 226 can individually include at least one of GaN, gallium arsenide (GaAs), aluminum gallium arsenide (AlGaAs), gallium arsenide phosphide (GaAsP), gallium (III) phosphide (GaP), zinc selenide (ZnSe), boron nitride (BN), AlGaN, and/or other suitable semiconductor materials. In one particular embodiment, the first semiconductor material 222 is N-type GaN and the second semiconductor material 226 is P-type GaN. In certain embodiments, the active region 224 can include a SQW, MQWs, or bulk material. The term "bulk semiconductor material" generally refers to a single grain semiconductor material, such as indium gallium nitride ("InGaN") with a thickness of approximately 10-50 nanometers. The SQW and MQWs can be In—GaN, or the active region 224 can include aluminum gallium indium phosphide ("AlGaInP"), aluminum gallium indium nitride ("AlGaInN"), and/or other suitable materials or configurations. The first semiconductor material 222, active region 224, and second semiconductor material 226 can be formed via chemical vapor deposition (CVD), physical vapor deposition (PVD), atomic layer deposition (ALD), MOCVD, MBE, LPE, HYPE, and/or other suitable techniques.

After forming the radiation transducer 220, a backside structure is formed over the second semiconductor material 226. In one embodiment, the conductive material 227 is deposited or otherwise formed on the second semiconductor material 226 to distribute an electrical current across the second semiconductor material 226. The conductive material 227 can be a transparent conductive material, such as indium tin oxide (ITO), or it can be a reflective conductive material (e.g., silver). When the conductive material 227 is a transparent material, the process optionally further includes depositing or otherwise providing the reflector 228 on the conductive material 227. The reflector 228 can be any suitable metal with a high reflectivity, such as silver, aluminum, copper or gold depending upon the color and extent of reflectivity desired in the device. After forming the conductive material 227, or optionally the reflector 228, the diffusion barrier 229 is formed at the backside of the wafer assembly 300. The diffusion barrier 29 can be selected according the diffusion properties of the other materials as known to a person skilled in the art.

Arrays of first and second contacts 231 and 232 are subsequently constructed in the wafer assembly 300 such that the first contacts 231 are electrically coupled to the first semiconductor material 222 and the second contacts 232 are electrically coupled to the second semiconductor material 226. The first contacts 231 are formed by etching first contact holes through the diffusion barrier 229, reflector 228, conductive material 227, second semiconductor material 226, and active region 224 such that the bottoms of the first contact holes terminate at or in the first semiconductor material 222. In one embodiment, the second contacts 232 are formed by etching second contact holes through the diffusion barrier 229 and reflector 228 such that the bottoms of the second contact holes terminate at or in the conductive material 227. Depending upon the conductivity of the reflector 228, the second contact holes can terminate at or in the reflector 228 instead of the conductive material 227. In another embodiment, the second contact holes can extend to the second semiconductor material 226. The second contacts 232 can accordingly be electrically coupled to the second semiconductor material 226 indirectly through one or more of the conductive material 227 and/or the reflector 228, or directly to the second semiconductor material 226 itself. After the holes have been formed, a thin dielectric material is disposed into the holes and over the exposed surface of the diffusion barrier 229. The dielectric material can be etched using a spacer etch process that removes the dielectric material from the top of the diffusion barrier 229 and the bottom of the holes to form the dielectric liners 233 and 234. The holes are then filled with a conductive material to form the first contacts 231 and the second contacts 232. The backside of the wafer assembly 300 can optionally be planarized to remove any excess conductive material and electrically isolate the first and second contacts 231 and 232 in the holes as shown in FIGS. 3A and 3B.

In an alternate embodiment (not shown), instead of have a buried second contact 232 as shown, the reflector 28 or the conductive material 27 can be electrically connected to a power source directly from the bottom surface. For example, in cases where the diffusion barrier 29 is sufficiently conductive or the diffusion barrier 29 is not present, the reflector 28 and/or the conductive material 27 can be mounted directly to a conductive pad.

Figure 4A:
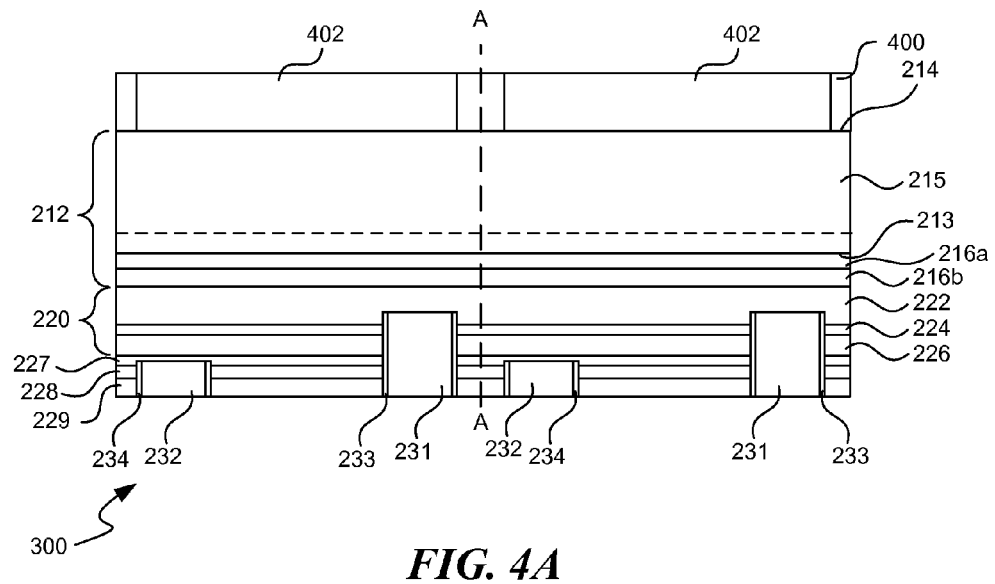
FIGS. 4A-4F are partially schematic cross-sectional views of additional stages of forming SSRT assemblies at the wafer level in accordance with an embodiment of a method of the present technology.
Figure 4B:
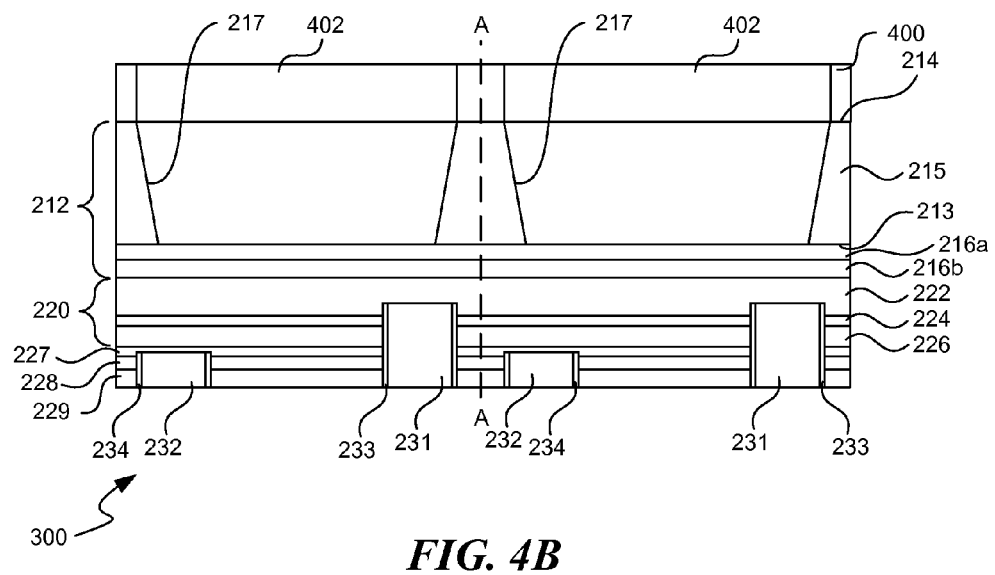
Figure 4C:
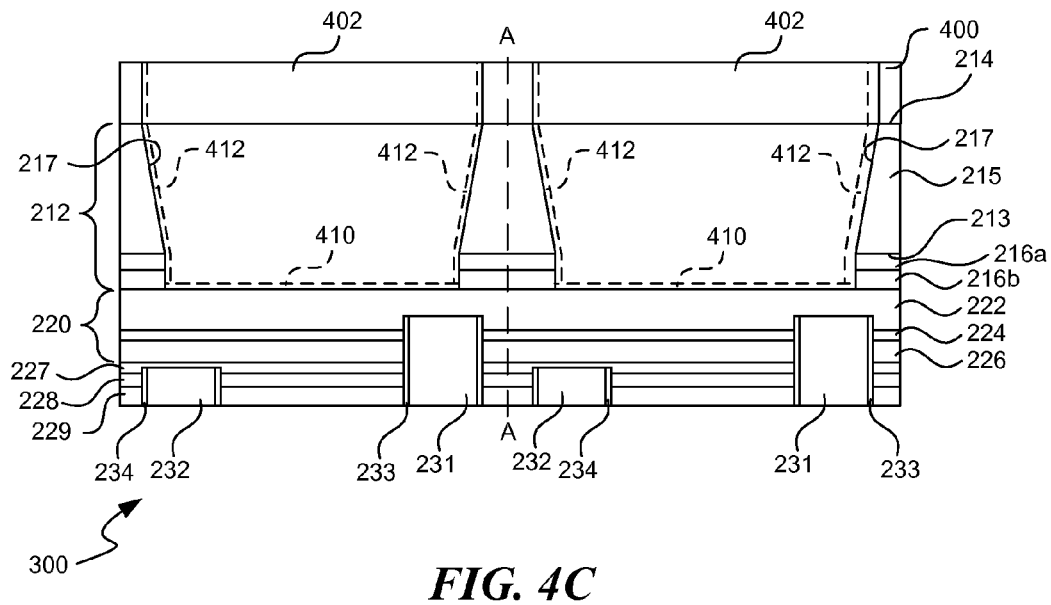

FIGS. 4A-4C are a partially schematic cross-sectional views illustrating stages of a process for forming openings in and/or through the growth substrate 212 to allow radiation to pass to and/or from the radiation transducer 220. FIG. 4A illustrates the wafer assembly 300 after a resist material 400 has been deposited onto the second side 214 of the growth substrate 212 and photo-patterned to have apertures 402 corresponding to the locations for the openings 217. FIG. 4B illustrates the wafer assembly 300 after the openings 217 have been formed through the base material 215 of the growth substrate 212. In one embodiment, the openings 217 are formed through the base material 215 using an isotropic etch, such as a KOH wet etch when the backside material 215 is silicon. This type of an etch will produce angled sidewalls that generally follow the crystallographic plane of the base material 215. In other embodiments, a combination of dry etching and wet etching, or just dry etching alone, can be used to increase the wall angle of sidewalls of the openings 217 (e.g., produce sidewalls that are closer to perpendicular to the second side 214 of the base material 215). The increased wall angle of the sidewalls of the openings 217 can provide for tighter packing or closer spacing of SSRTs at the wafer level processing, thereby increasing the density of die per unit area and increasing the number of die per wafer.

If the buffer materials 216a and 216b are not sufficiently transmissive to the radiation, the openings 217 can be etched through the buffer materials 216a-b until areas of the first semiconductor material 222 are exposed through the openings 217. Referring to FIG. 4C, for example, the buffer materials 216a and 216b can be etched using an anisotropic etching process or an additional wet etch designed to selectively remove the buffer materials 216a-b relative to the first semiconductor material 222. In one embodiment, the process can optionally include depositing a thin polymer film 410 (shown in dashed lines) to cover the exposed areas of the first semiconductor material 222, and depositing a thin reflective film 412 (shown in dashed lines), such as silver, to coat the sidewalls of the growth substrate 212. For example, the thin polymer film 410 can cover the exposed areas using a selective deposition or global deposition with a thermal reflow to remove the polymer material from the sidewalls while leaving the bottom areas coated with the polymer. The polymer film 410 can remain on the exposed surfaces of the first semiconductor material 222 after forming the thin reflective film 412, or the polymer film 410 can be removed to fully expose the areas of the first semiconductor material 222 aligned with the openings 217.

Figure 4D:
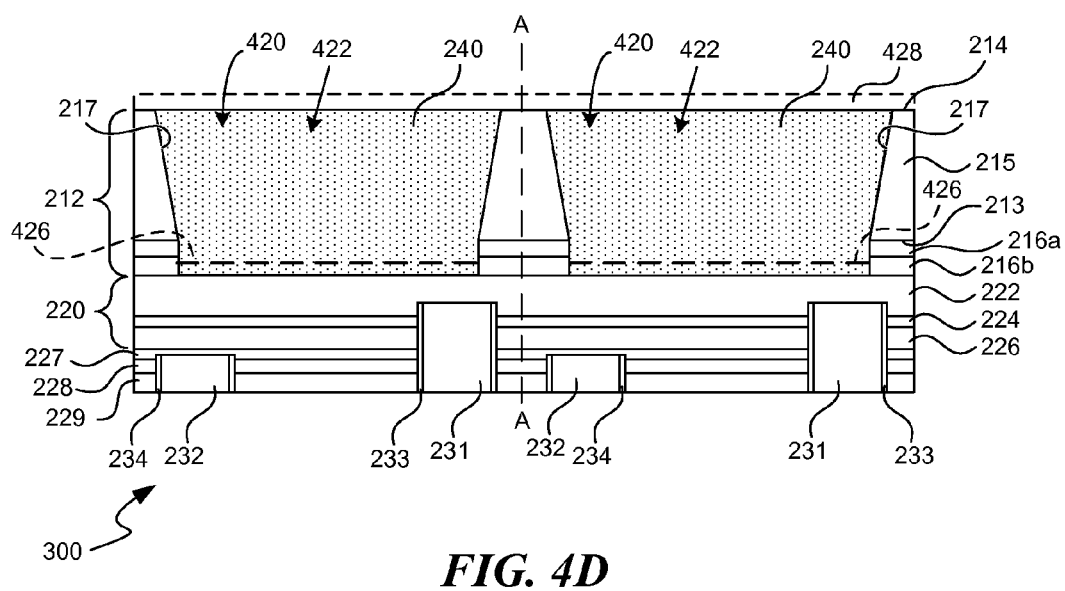

FIG. 4D is a partially schematic cross-sectional view illustrating the wafer assembly 300 after the resist 400 (FIG. 4C) has been removed and covers 240 have been formed in corresponding openings 217. The covers 240 can comprise a transmissive matrix material 420 (shown schematically as open area between dots) and a converter material 422 (shown schematically as the dots) distributed in the matrix material 420. The matrix material 420, for example, can include silicone, glass, polymeric materials, or other materials having suitable transmission properties relative to the radiation generated or received by the radiation transducer 220. The converter material 422 can include a phosphor material, such as a serium (III)-doped yttrium aluminum garnet ("YAG") at a particular concentration for emitting a range of colors under photoluminescence (e.g., green, yellow and/or red). In other embodiments, the converter material 422 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium (IV)-doped YAG, dysprosium-doped YAG, samarium-doped YAG, terbium-doped YAG, and/or other suitable wavelength conversion materials. Emissions (e.g., light) from the radiation transducer 220 can irradiate the converter material 422, and the irradiated converter material can emit a light of a certain quality (e.g., color, warmth, intensity, etc.).

In the embodiment illustrated in FIG. 4D, the converter material 422 is distributed at least substantially homogeneously throughout the matrix material 420. In other embodiments, the converter material 422 can settle under gravitational or thermodynamic forces within the matrix material 420 such that a lower region 426 (shown in dashed lines) or an upper region (not shown) of the cover 240 has a higher concentration of converter material 422 than the region above. In still another embodiment, the cover 240 can optionally include a separate converter section 428 (shown in dashed lines) above the openings 217 in addition to or in lieu of the converter material 422. For example, such a separate converter section 428 can include a second converter material in addition to the converter material 422 distributed within the matrix material 420. The second converter material in the converter section 428 can emit a different wavelength of light to further control the cumulative light generated by the device. On the other hand, the portion of the cover 240 within the openings 217 can include only the transmissive matrix material 420 without any converter material 422, and the converter section 428 can include a separately deposited converter material.

The covers 240 can be formed by uniformly covering the entire wafer with a mixture of the matrix material 420 and converter material 422. Any excess material on the second side 214 of the growth substrate 212 can be removed from the wafer assembly 300 before the matrix material 420 is cured, or the matrix material 420 can be cured first and then the excess material may be planarized to isolate the covers 240 in the openings 217. In other embodiments, the matrix material 420 may preferentially be wetted from the second surface 214 of the growth substrate 212 such that the matrix material 420 and converter material 422 reside only in the openings 217.

Figure 4E:
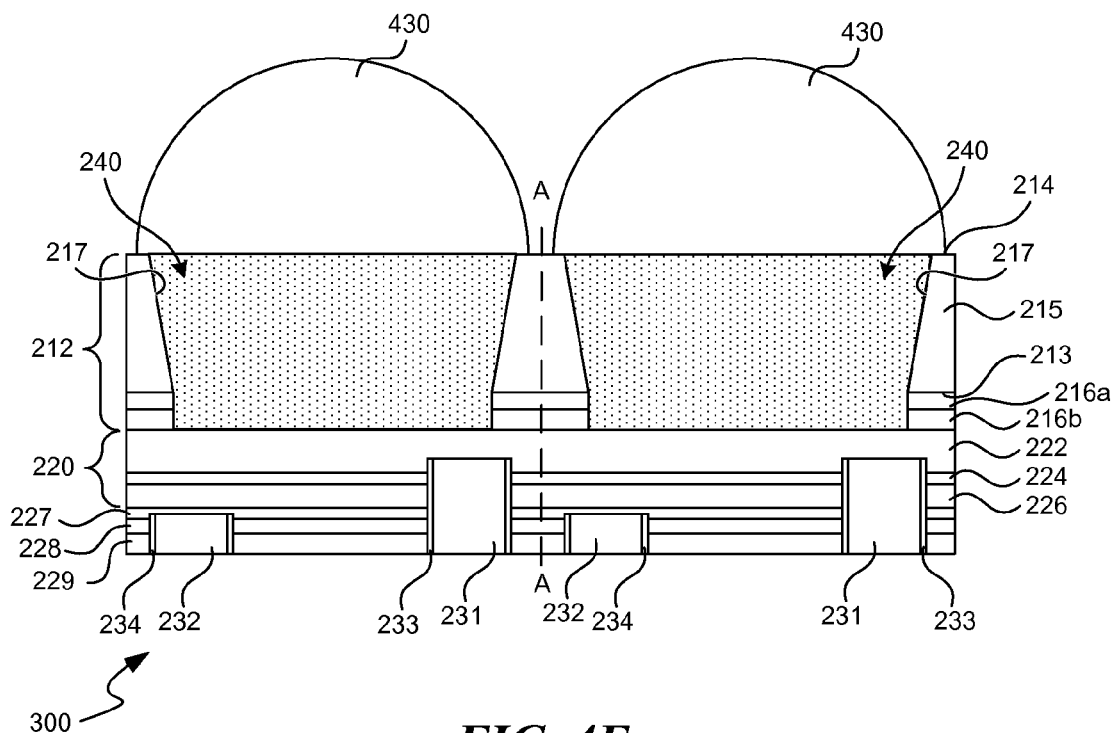

FIG. 4E is a partially schematic cross-sectional view illustrating a subsequent stage in which micro-lenses 430 are formed over the covers 240. The micro-lenses 430 can be formed using known techniques at the wafer level before the individual dies are cut apart from each other. The micro-lenses 430, for example, can include silicone or other polymeric materials that are deposited using a pen-like dispenser or molded or imprinted directly onto the covers 240. In other embodiments, the micro-lenses can be preformed and attached to the covers 240.

Figure 4F:
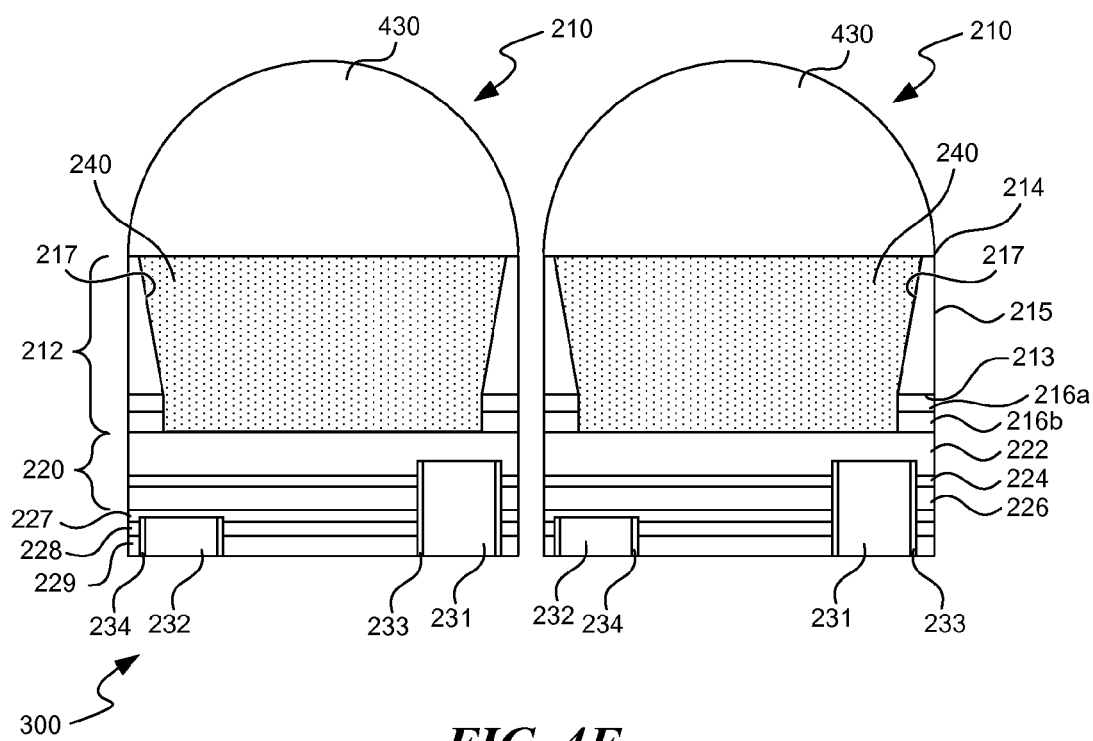

FIG. 4F is a partially schematic cross-sectional view illustrating a plurality of the SSRT assemblies 210 after they have been separated from each other along lanes A-A using a dicing or other process. Each individual SSRT assembly 210 can then be mounted to an interposer substrate and encapsulated to form a system similar to the system 200 described above with reference to FIG. 2.

In an alternate embodiment, a plurality of dies can be electrically coupled together to form an integrated array of SSRT assemblies. Referring to FIG. 4E, instead of cutting the wafer assembly 300 along lanes A-A, the wafer could be cut to have two or more SSRT assemblies 210 that remain coupled together on the same section of the growth substrate 212. Additionally, before cutting the wafer, a conductive backside routing structure could be formed at the wafer level. The backside routing structure could commonly connect sets of positive or negative contacts of the SSRT assemblies 210 in the array. For example, the backside routing structure could have a first lead or bus commonly connecting the first contacts 231 together and a second lead or bus commonly connecting the second contacts 232 together. The first lead can be electrically coupled to a first external terminal and the second lead can be electrically coupled to a second external terminal.

Figure 5A:
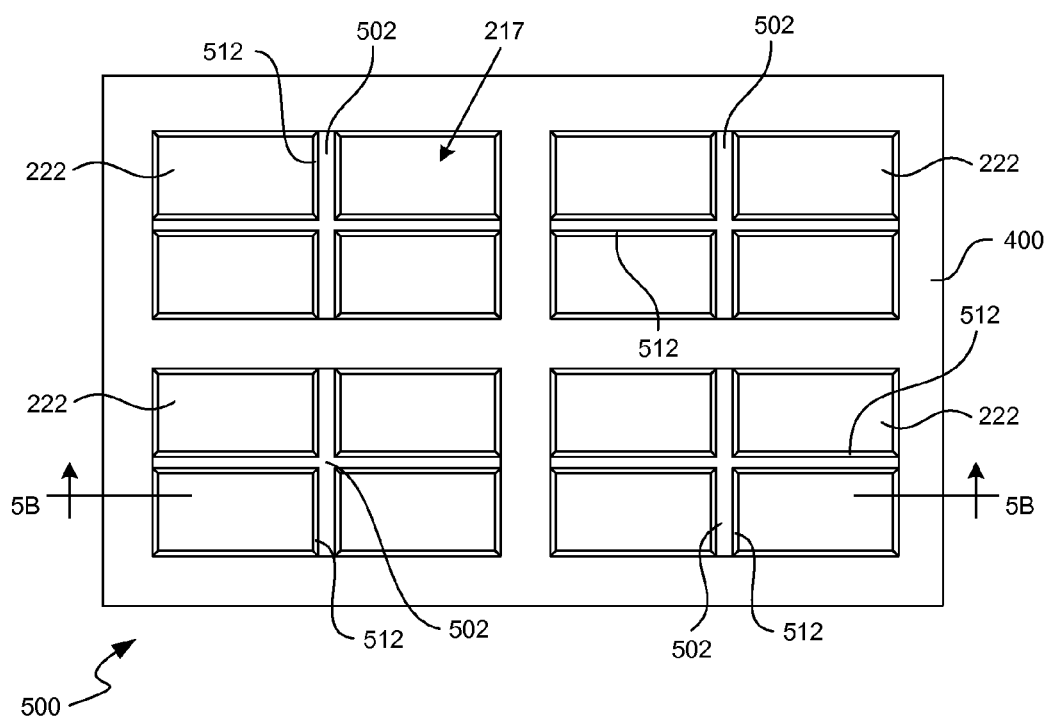
FIG. 5A is partially schematic top plan view of a portion of a method for manufacturing SSRT assembles at the wafer level in accordance with another embodiment of the technology.
Figure 5B:
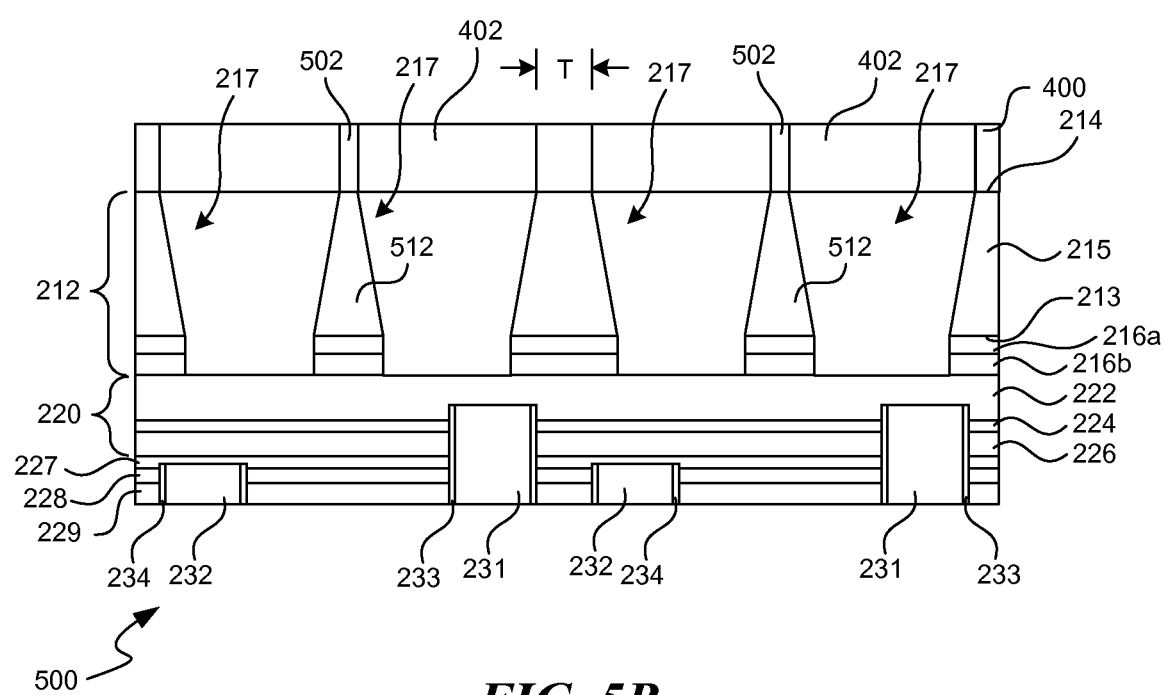
FIG. 5B is a partially schematic cross-sectional view taken along cross-section 5B-5B of FIG. 5A.

FIG. 5A is a partially schematic top plan view of a substrate assembly 500 in accordance with another embodiment of the technology, and FIG. 5B is a partially schematic cross-sectional view taken along cross-section line 5B-5B of FIG. 5A. The substrate assembly 500 is similar to the substrate assembly 300 illustrated in FIG. 4C, but the substrate assembly 500 further includes supports 512 in the openings 217. In one embodiment, the supports have a cross-like shape as shown in FIG. 5A and extend from the first surface 213 to the second surface 214 of the base material 215 as shown in FIG. 5B. The supports 512 can be formed by patterning the resist 400 to have elements 502 in the apertures 402 over the areas where the supports 512 are to be formed. The openings 217 can then be etched through the growth substrate 212 as described above with reference to FIGS. 4B and 4C. The supports 512 may relieve stress in the open areas of the radiation transducers 220 to prevent or inhibit buckling of the radiation transducer 220. The supports 512 should accordingly enable the wall thickness T between adjacent dies to be reduced in a manner that increases the overall exposed area of the radiation transducer 220 at each die.

Several embodiments of the technology are expected to reduce the costs of packaging and handling SSRT assemblies. For example, in conventional LEDs formed on an opaque or insufficiently transmissive growth substrate, the growth substrate must be removed from the light emitting structure. This often results in a very thin die that is difficult to handle and package. As such, after removing the growth substrate, a separate carrier substrate is attached to the light emitting structure of a conventional LED. In contrast to the conventional structures, several embodiments of the present technology remove only a portion of the growth substrate to expose the radiation transducer such that the remaining portion of the growth substrate can support the radiation transducer through subsequent handling and processing. Several embodiments of the present technology are accordingly expected to eliminate the need for a separate carrier substrate and the processing necessary to attach the separate carrier substrate to the radiation transducer.

Additionally, several embodiments of the technology are expected to further simplify manufacturing by forming a backside routing structure to commonly connect the contacts of a plurality of SSRT assemblies in an array. This enables the routing to be formed at the wafer level using known techniques for forming redistribution layers and the like on memory or processor dies.

From the foregoing, it will be appreciated that specific embodiments of the invention have been described herein for purposes of illustration, but that various modifications may be made without deviating from the spirit and scope of the invention. A person skilled in the art will understand that various aspects of the individual embodiments shown and described with reference to FIGS. 2-5B can be combined in different combinations. For example, the wafer assembly 500 can be cut such that a plurality of SSRTs remain integrated on the same section of the growth substrate and are commonly connected with backside routing as described above. Accordingly, the invention is not limited except as by the appended claims.

We claim:

1. A solid state radiation transducer, comprising:
   a growth substrate having a first side, a second side opposite the first side, and an opening extending from the second side to the first side;
   a radiation transducer having a first semiconductor material formed on the first side of the substrate, an active material formed on the first semiconductor material, and a second semiconductor material formed on the active material, wherein the first semiconductor material is exposed through the opening at the first side of the growth substrate such that the radiation can pass to and/or from the radiation transducer; and
   a first contact electrically coupled to the first semiconductor material and a second contact electrically coupled to the second semiconductor material, wherein:
   the radiation transducer is a light emitting diode in which the first semiconductor material comprises an N-type GaN, the second semiconductor material comprises a P-type GaN, and the active region comprises gallium nitride/indium gallium nitride;
   the growth substrate comprises silicon (1,1,1) at the first side;
   the solid state radiation transducer further comprises a cover having a phosphor and a transmissive matrix material that at least partially fills the opening.

2. The solid state radiation transducer of claim 1, wherein the phosphor is on the transmissive matrix material.

3. The solid state radiation transducer of claim 1, wherein the phosphor is mixed with the transmissive matrix material.

4. The solid state radiation transducer of claim 1, further comprising a support in the opening that extends from the first semiconductor material to a plane defined by the second side of the growth substrate.

5. A solid state radiation system, comprising:
   a growth substrate having a first side, a second side opposite the first side, and a plurality of openings extending from the second side to the first side;
   a plurality of radiation transducers, wherein individual radiation transducers are located at a corresponding opening, and wherein the radiation transducers have a first semiconductor material formed on the first side of the substrate, an active material formed on the first semiconductor material, a second semiconductor material formed on the active material, a first contact electrically coupled to the first semiconductor material, and a second contact electrically coupled to the second semiconductor material, wherein at least a portion of the first semiconductor material of the individual radiation transducers is exposed through the corresponding opening at the first side of the growth substrate such that the radiation can pass to and/or from the radiation transducers; and
   a backside routing structure at a side proximate the second semiconductor material, the routing structure having a first lead electrically connecting the first contacts together, a first terminal electrically coupled to the first lead, a second lead electrically connecting the second contacts together, and a second terminal electrically coupled to the second lead.

6. The solid state radiation system of claim 5, further comprising a cover having a transmissive material at least partially filling the openings and a phosphor.

7. The solid state radiation system of claim 6, wherein the cover comprises a single element over a plurality of the openings.

8. The solid state radiation system of claim 6, wherein the cover comprises a plurality of discrete cover elements, and individual cover elements are at a corresponding one of the openings.

9. A packaged solid state radiation transducer, comprising:
   an interposer substrate having first terminals at a first side and second terminals at a second side opposite the first side electrically coupled to corresponding first terminals;
   a solid state radiation system mounted to the interposer substrate, the solid state radiation system having a first substrate with an epitaxial growth material, a first semiconductor material on the first substrate, an active region on the first semiconductor material, a second semiconductor material on the active region, a first contact electrically coupled to the first semiconductor material and one of the first terminals of the interposer substrate, a second contact electrically coupled to the second semiconductor material and another one of the first terminals of the interposer substrate, and wherein the first substrate has an opening through which radiation can pass to and/or from the first semiconductor; and
   a casing around a portion of the solid state radiation system.

* * * * *